United States Patent
Pawlenko et al.

(10) Patent No.: US 6,415,493 B1
(45) Date of Patent: Jul. 9, 2002

(54) METHOD AND APPARATUS FOR PRECISE POSITIONING OF A CIRCUIT BOARD TO A MOUNTING PLATE

(75) Inventors: Ivan Pawlenko, Holland, PA (US); David B. Philips, Bexley, OH (US); Larry Samson, Langhorne, PA (US); Richard Schwartz, Cranbury, NJ (US); Thomas E. Wiecek, Pickerington, OH (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/538,099

(22) Filed: Mar. 29, 2000

(51) Int. Cl.[7] .............................................. B25B 27/14
(52) U.S. Cl. ...................... 29/281.1; 29/559; 29/281.6; 269/903
(58) Field of Search ................................ 29/281.1, 559, 29/281.5, 281.6; 269/903, 229, 196, 235, 231, 217

(56) References Cited

U.S. PATENT DOCUMENTS

| | | | | |
|---|---|---|---|---|
| 4,741,090 A | * | 5/1988 | Monnier | 29/281.1 |
| 5,927,589 A | * | 7/1999 | Yang | 29/281.1 |
| 6,164,634 A | * | 12/2000 | Farlow | 269/903 |
| 6,176,008 B1 | * | 1/2001 | Ueoka | 269/903 |
| 6,189,876 B1 | * | 2/2001 | Frazier | 29/559 |

* cited by examiner

Primary Examiner—Joseph J. Hail, III
Assistant Examiner—Lee Wilson
(74) Attorney, Agent, or Firm—Woodbridge & Associates, P.C.; Richard C. Woodbridge

(57) ABSTRACT

A printed circuit board is aligned to its mounting plate by using cutouts already cut for electronic components. A top plate with a notched location block and two edge locators is placed on top of both the printed circuit board and the mounting plate so that the notched block straddles two cutouts on the board and the mounting plate. At the same time, the two edge locators are placed inside the two matching cutouts. An eccentric cam is used to move a pressure plate that slides on top of the top plate and pushes both the circuit board and the mounting plate with spring action. The cam is turned until the edge locators hit the edges of the cutouts, aligning the printed circuit board to the mounting plate.

11 Claims, 6 Drawing Sheets

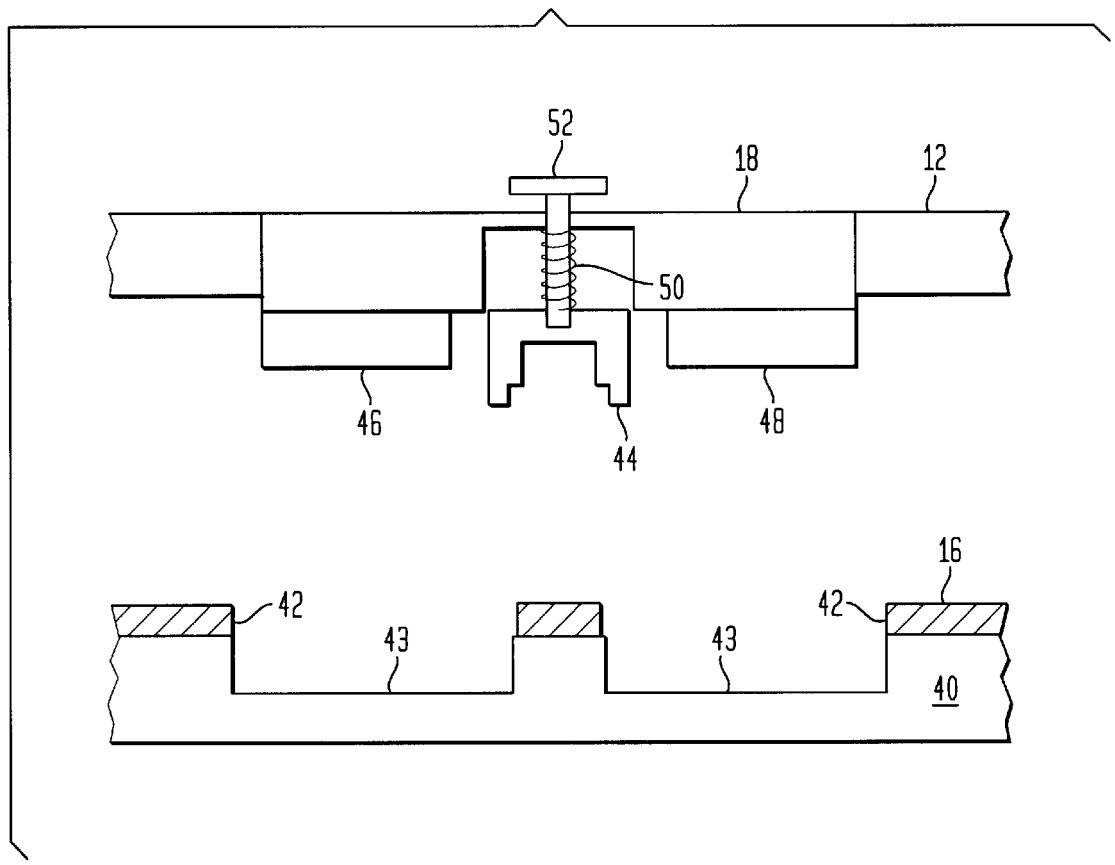

METHOD AND APPARATUS FOR PRECISE POSITIONING OF A CIRCUIT BOARD TO A MOUNTING PLATE

BACKGROUND OF THE INVENTION

1. Field of the Invention

The present invention lies in the area of printed circuit board (PCB) assembly.

2. Description of the Related Art

The assembly of electronic components containing a printed circuit board sometimes requires that the PCB be precisely positioned (±0.001 inches or so) on a mounting plate (sometimes called a carrier plate). Alternately, the PCB may need to be positioned precisely on a heat sink. Indeed, positioning needs to be especially precise when assembling components in RF applications, where correct performance of the final assembly depends on precise positioning of the PCB on the mounting plate.

The prior art contains a number of different methods for precise positioning of the PCB relative to the mounting plate. The simplest method is for the assembly operator to manually align the PCB using visual inspection. Although acceptable to a degree, visual inspection is naturally subject to human errors. In addition, visual inspection may require additional time during assembly in order to have an acceptable degree of alignment.

Another technique is to insert dowel pins into the mounting plate, where the pins match corresponding holes on the PCB. Closely related is the technique of inserting alignment blocks into features in the mounting plate. Both of these techniques however, add the required step of adding pins or blocks or similar fixtures to the mounting plate that serve no useful purpose other than PCB alignment during the assembly process. In addition, holes will need to be cut in the PCB solely for the purpose of aligning the components. These prior art techniques add cost to the manufacturing of the mounting plate or the PCB.

By contrast, the present invention solves these alignment problems by taking advantage of features already existing on both the PCB and the mounting plate. The described mechanism manages to utilize cutouts already found on the PCB.

SUMMARY OF THE INVENTION

Briefly described, the invention is an apparatus and method for precisely aligning a printed circuit board (PCB) to a mounting plate onto which the PCB will be fastened by taking advantage of component cutouts already cut into both the PCB and the mounting plate. The mechanism consists of two major plates, one mounted onto the other by means of an eccentric cam. The larger top plate contains holding pins for the mounting plate as well as a notched center locator and two edge locators, all of which project through both cutouts on the PCB and the mounting plate. The mounting plate and PCB are moved into position by means of a pressure plate mounted onto the top plate by means of an eccentric cam. The pressure plate contains one set of leaf springs for moving the PCB and a pair of spring plungers for moving the mounting plate.

The operator begins by placing the top plate on top of both the PCB and the mounting plate and wiggles the center locator until it matches up with a notch cut between two cutouts that exist both on the PCB and the mounting plate. The operator then fits two edge locators into the two cutouts, and fits the pressure plate so that one set of springs contacts the PCB while the other contacts the mounting plate. Once the PCB, the mounting plate and the top plate are in place, the operator rotates the eccentric cam, pushing both PCB and mounting plate along the cutouts and back towards the operator until the edge locators reach the end of the cutout, thereby aligning the respective plates.

BRIEF DESCRIPTION OF THE DRAWINGS

FIG. 8 is a front sectional view illustrating a spring-mounted center locator along with edge locators in greater detail prior to engaging the cutouts.

DETAILED DESCRIPTION OF THE PREFERRED EMBODIMENT

A method and apparatus for precisely mounting a printed circuit board to a base or mounting plate is disclosed. During the course of this description, like numbers will be used to identify like elements according to the different views which illustrate the invention.

Figure 1:
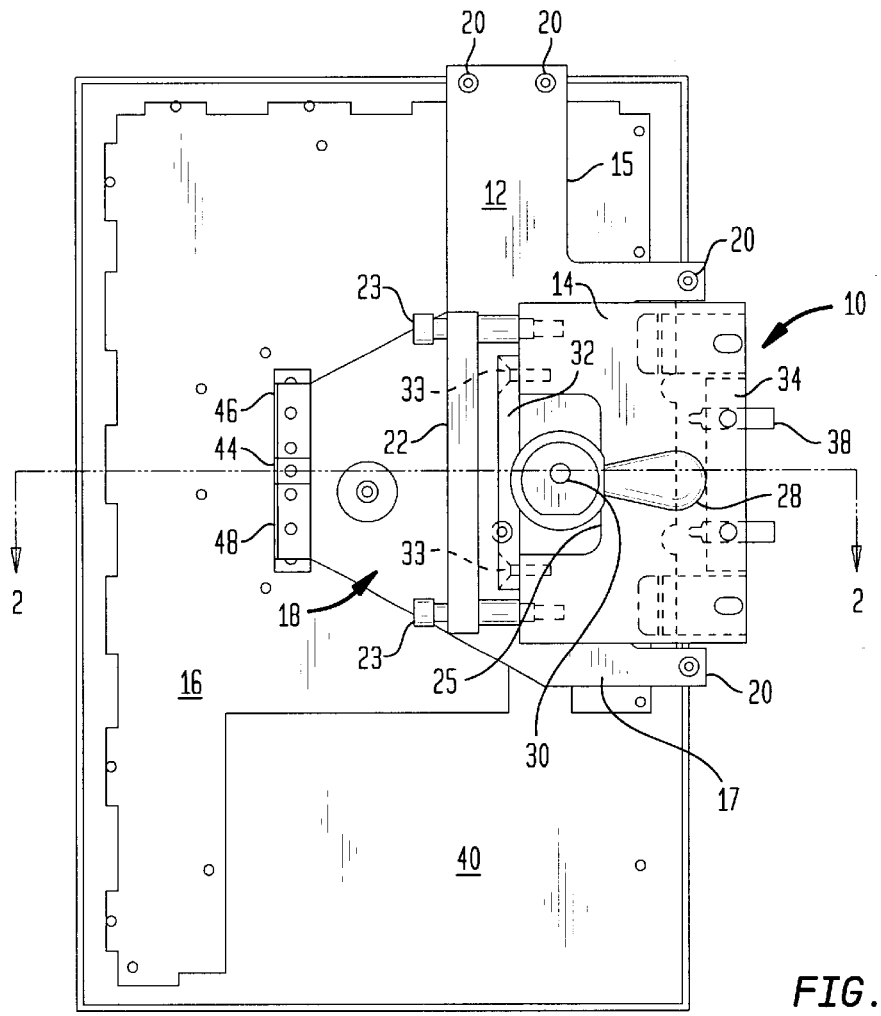
FIG. 1 illustrates a top plan view of the apparatus, including the two plates and the eccentric cam, as well as the PCB and mounting plate
Figure 3:
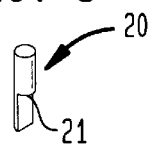
FIG. 3 illustrates an edge pin structure.
Figure 4:
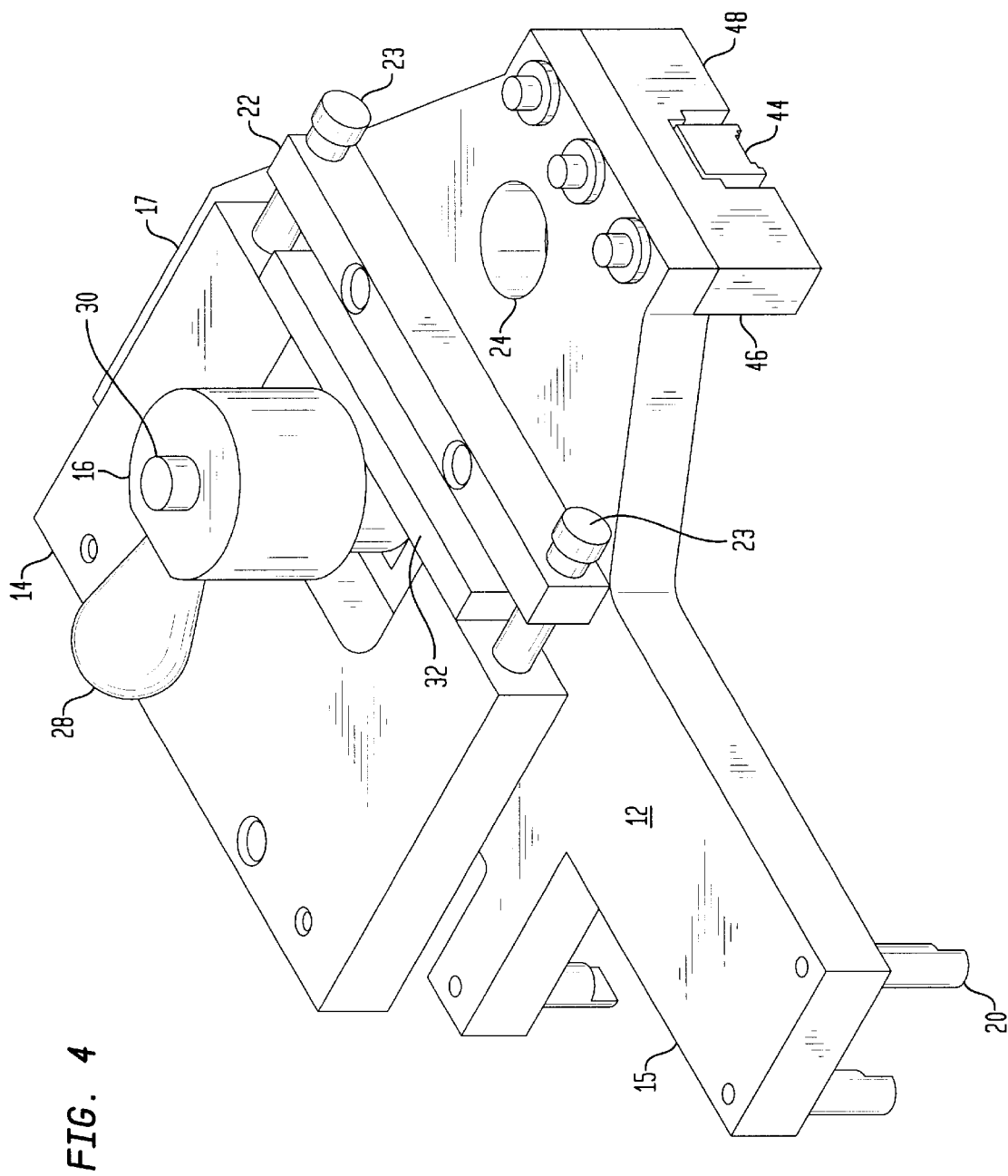
FIG. 4 illustrates a perspective view of the apparatus.

A locating apparatus 10 is illustrated in FIG. 1. The preferred embodiment consists of two plates—a top plate 12 for initial positioning of the PCB 16 and mounting plate 40 as well as a pressure plate 14 for more precise positioning of the PCB. As shown in FIGS. 1 and 4, the top plate 12 may contain a wing 15 and is supported by a plurality of edge pins 20. As shown in FIG. 3, the pins are all of similar height and each pin 20 is essentially cylindrical in nature with a notch 21 cut in the bottom to allow the pin to fit on top of the mounting plate 40. The pins hold the sides of the top plate 12 level as it rests on the mounting plate and also aid in positioning the top plate (and thus the entire apparatus) relative to the mounting plate and the printed circuit board.

Figure 6:
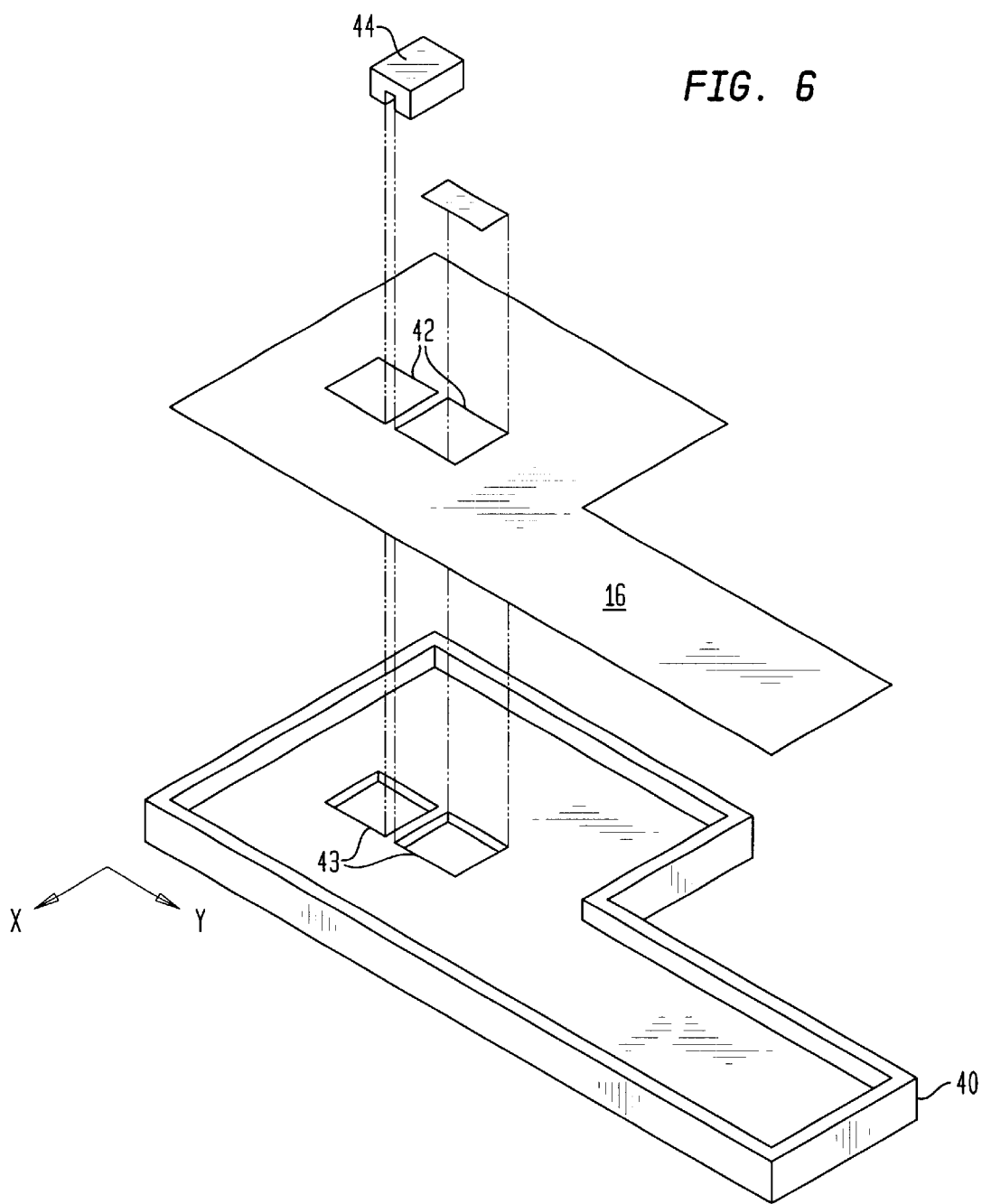
FIG. 6 illustrates how the center locator and one edge locator project into cutouts on a PCB and cutouts on the mounting plate.
Figure 7:
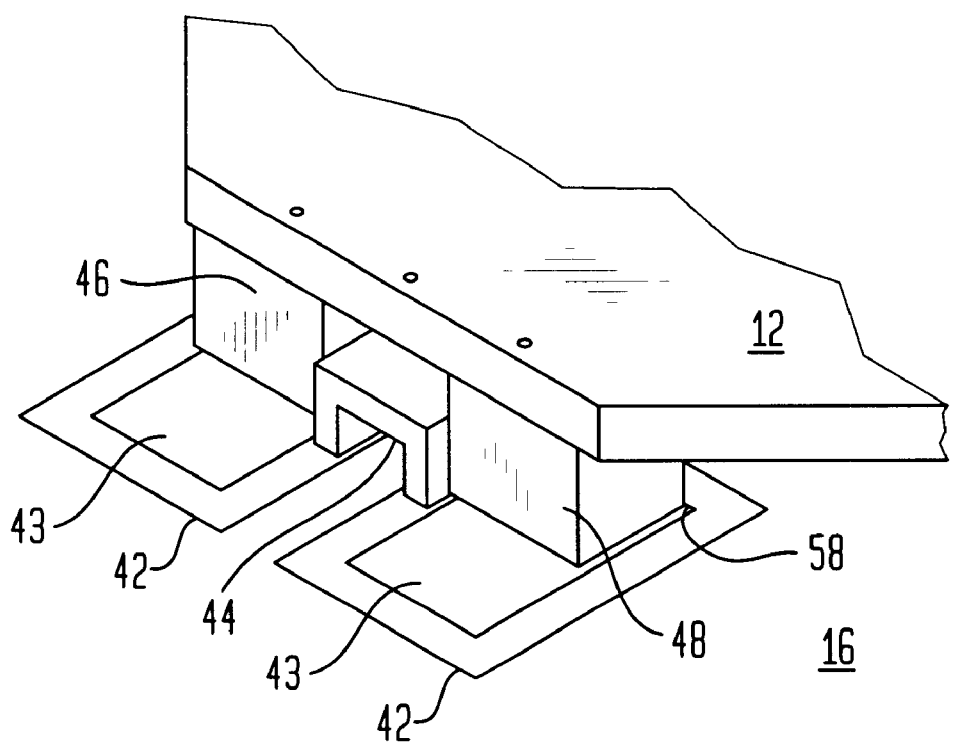
FIG. 7 illustrates how the center locator and edge locators of FIG. 6 align the cutouts on the PCB with the cutouts on the mounting plate.

As shown in FIGS. 1 and 4, the top plate 12 itself is trapezoidal in nature, with a narrower end 17 toward the center of the PCB and the mounting plate. The narrow end 17 contains a locator fixture 18, which contains a center locator 44, a left edge locator 46 and a right edge locator 48. As shown in FIGS. 6 and 7, the PCB and mounting plate typically will have existing cutouts for placement of components, and the edge locators use the edges of these apertures to align the top plate with the PCB and mounting plate. In addition, the top plate may contain a hole 24 in order to accommodate tools for fastening the PCB to the mounting plate.

The pressure plate 14 rests atop the top plate 12 and serves to precisely align the printed circuit board 16 to the mounting plate 40 (FIG. 1). The pressure plate contains a unshaped cutout 25 for placement of an eccentric cam 26, whose shaft 27 reaches all the way to fit a hole 29 in the top plate 12. The eccentric cam 26 is turned by means of a knob 28 that is fastened to the cam by a shoulder screw 30. A replaceable wear plate 32 that serves as the cam follower is attached to the pressure plate by a plurality of screws 33. In addition, a guide bar 22 for adjusting position of the pressure plate 14 is attached by a pair of shoulder screws 23.

Figure 2:
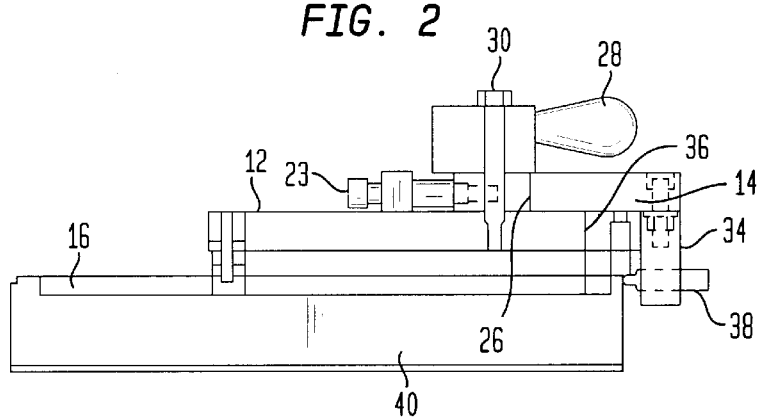
FIG. 2 illustrates a side sectional view of the apparatus with PCB and the mounting plate.
Figure 5:
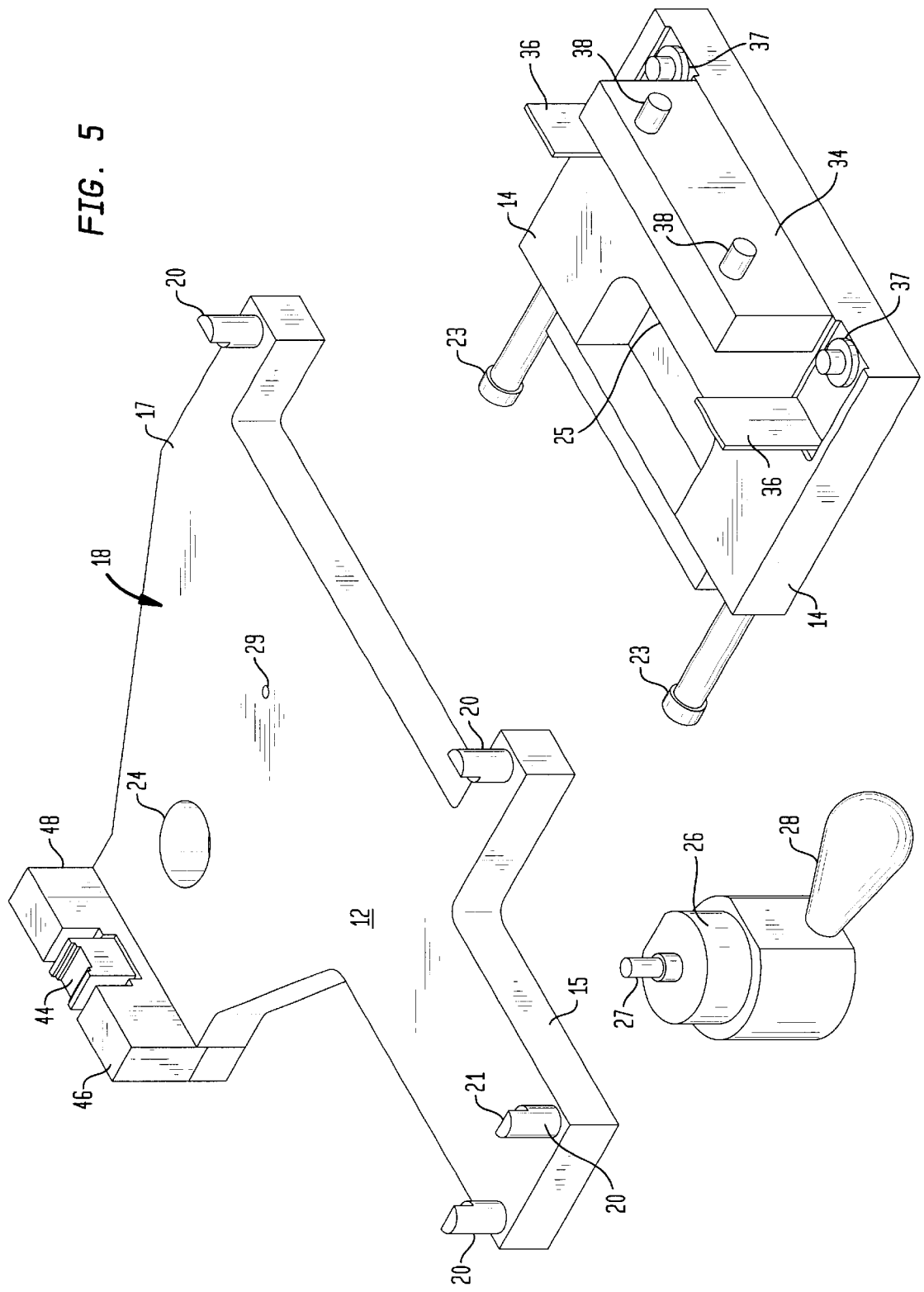
FIG. 5 illustrates an exploded bottom view of the apparatus, showing the leaf springs and the spring plungers.

Referring to FIG. 2, a plunger block 34 is fastened vertically and perpendicular to the underside of the pressure plate 14. Two spring plungers (such as Vlier plungers) 38 protrude perpendicularly from the plunger block 38 for pushing the mounting plate 40. In addition, the pressure plate 14 contains a pair of leaf springs 36 that protrude perpendicularly down from the pressure plate 14 and serve to move the PCB 16. The spring plungers 38 are by nature adjustable, while the leaf springs 36 are adjusted forward or backward by a pair of screws 37 (FIG. 5).

The operator first places the PCB 16 on top of the mounting plate 40 so that they are roughly aligned to each other. The operator then places the apparatus 10 onto both the PCB 16 and the mounting plate 40, and uses the edge pins to align the top plate 12 with the edges of the mounting plate 40. The operator then wiggles the top plate 12 until the PCB 16 clicks into the center locator 44 when the center locator straddles two cutouts 42 on the printed circuit board. In a similar process, the operator wiggles the top plate until the mounting plate 40 clicks into the center locator 44 and is straddling the matching cutouts 43 located on the mounting plate. Typically, the center locator 44 will contact the PCB first, and as shown in FIG. 8, one variation on the center locator 44 involves placing a spring 50 on the center locator to permit more adjustment before engaging the cutouts 42 and 43.

Once the center locator 44 has locked into the PCB 16 and the mounting plate 40, the operator will finish securing the top plate 12 to the PCB 16 and the mounting plate 40. The top plate 12 is lowered and wiggled slightly so that the edge locators 46 and 48 engage the cutouts 43 on the mounting plate 40 and the matching cutouts 42 on the PCB 16, and the spring plungers 38 are engaged at the back of the mounting plate 40. At this point, both major parts of the assembly—the pressure plate 14 and the top plate 12 should be ready for the final alignment. The leaf springs 36 that hang down from the pressure plate 14 should be in position to contact the PCB 16. In addition, the PCB 16 and the mounting plate 40 should be approximately centered and aligned in the y-direction (i.e. perpendicular to the direction that the cam will push the PCB 16), as shown in FIG. 6.

The final alignment requires the operator to slide the PCB 16 back against the two leaf springs 36, which are in turn fastened to the pressure plate. The operator then turns the eccentric cam knob 28, rotating the cam 26, which moves the pressure plate 14 and thus the leaf springs 36. The leaf springs 36 gently push or bias the PCB 16 in a direction back towards the user, as the center locator 44 prevents the PCB from sliding laterally (i.e., perpendicular to the leaf springs' pushing force). At the same time, the spring plungers 38 move the mounting plate 40 in the same direction as the PCB 16 but not at the same speed as the leaf springs 36 and spring plungers 38 will have differing stiffness and damping characteristics.

The operator continues to turn the cam 26, biasing the PCB 16 and mounting plate 40 until the edge locators (46 and 48) touch the edges 58 of the PCB cutouts 42. At this point, the edge locators 46 and 48 align the cutouts 43 of the mounting plate 40 with the cutouts 42 on the PCB, as shown in FIG. 7. Rotating the cam 26 will not move the PCB 16 any further, and the operator can then use both hands to rigidly fasten the PCB 16 to the mounting plate 40 with screws or other fasteners. The eccentric cam 26, leaf springs 36 and edge locators 46,48 will hold the PCB 16 and mounting plate 40 in alignment. If desired, the operator can make visual confirmation that the PCB 16 is aligned to the mounting plate 40 prior to fastening the PCB 16 to the mounting plate 40. Once the PCB 16 has been rigidly fastened, the operator can then release the cam and lift the apparatus 10 in preparation for assembling the next PCB 16 and mounting plate 40.

Thus, the present invention allows the operator to repeatably align a PCB to a mounting plate and to fasten the PCB to the plate while holding a precise and consistent alignment in place. Most significantly, the present invention takes advantage of cutouts (i.e. holes) that have already been cut into both PCB and mounting plate for the purpose of receiving electronic components such as transistors. This eliminates the need for special pins or extra machining in order to achieve proper alignment.

While the invention has been described with reference by the preferred embodiment thereof, it will be appreciated by those of ordinary skill in the art that modifications can be made to the structure and elements of the invention without departing from the spirit and scope of the invention as a whole.

We claim:

1. An apparatus for positioning a printed circuit board for assembly on top of a mounting plate comprising:
    a top plate;
    a plurality of pins located on said top plate for supporting said top plate on top of said mounting plate;
    a location means attached to one end of the top plate; and,
    biasing means to bias both said printed circuit board and said mounting plate into alignment with said location means.

2. The apparatus of claim 1, wherein said top plate has a first aperture capable of receiving a cam shaft, whereby said biasing means comprises the following:
    a pressure plate having a first plurality of springs attached and cam shaft receiving means for receiving a cam shaft, wherein said first plurality of springs is used to contact said printed circuit board;
    a plunger block attached to end of said pressure plate at right angles, said plunger block containing a second plurality of springs protruding perpendicular to said plunger block, wherein said second plurality of springs is used to contact said mounting plate; and,
    a cam attached via a cam shaft to said top plate, said cam fitting in said cam shaft receiving means located on said pressure plate, wherein turning said cam moves said pressure plate, thereby moving both said printed circuit board and said mounting plate into alignment with said location means.

3. The apparatus of claim 2, wherein said top plate is trapezoidal in shape, with the short end containing said location fastener.

4. The apparatus of claim 2, wherein said top plate contains a rectangular flange.

5. The apparatus of claim 2, wherein said location means comprises a plurality of blocks capable of projecting through a cutout located on said printed circuit board and a cutout located on said mounting plate.

6. The apparatus of claim 5, wherein said location means has at least one notched member.

7. The apparatus of claim 6, wherein said location means consists of a notched center location block and two edge location blocks.

8. The apparatus of claim 7, wherein said center location block is mounted by a spring.

9. The apparatus of claim 2, wherein said first plurality of springs comprises leaf springs.

10. The apparatus of claim 2, wherein the second plurality of springs located on the block comprises spring plungers.

11. The apparatus of claim 2, wherein said first plurality of springs and said second plurality of springs have different stiffnesses, thereby permitting said printed circuit board to be moved at a different rate than said mounting plate.

* * * * *